US011131701B1

(12) United States Patent
Mathis

(10) Patent No.: US 11,131,701 B1
(45) Date of Patent: Sep. 28, 2021

(54) MULTI-PROBE ANECHOIC CHAMBER FOR BEAM PERFORMANCE TESTING OF AN ACTIVE ELECTRONICALLY STEERED ARRAY ANTENNA

(71) Applicant: The United States of America, as Represented by the Secretary of the Navy, Arlington, VA (US)

(72) Inventor: Ronald F. Mathis, Camarillo, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 169 days.

(21) Appl. No.: 16/503,174

(22) Filed: Jul. 3, 2019

(51) Int. Cl.
   *G01R 29/08* (2006.01)
   *H01Q 21/06* (2006.01)
   *H04B 17/15* (2015.01)

(52) U.S. Cl.
   CPC ....... *G01R 29/0821* (2013.01); *H01Q 21/064* (2013.01); *H04B 17/15* (2015.01)

(58) Field of Classification Search
   CPC .. H01Q 1/00; H04W 4/00; G01R 1/00; H04L 1/00; H01P 1/00
   See application file for complete search history.

(56) References Cited

U.S. PATENT DOCUMENTS

| 5,631,661 A | 5/1997 | Sanchez | |
|---|---|---|---|
| 10,110,326 B1 | 10/2018 | Kyrolainen | |
| 2013/0169500 A1* | 7/2013 | Bilotti | H01Q 15/0053 343/786 |
| 2014/0218230 A1* | 8/2014 | Ostadrahimi | A61B 5/0507 342/179 |
| 2015/0236414 A1* | 8/2015 | Rosen | H01Q 21/0043 342/371 |
| 2016/0233970 A1* | 8/2016 | Reed | H04B 17/12 |
| 2018/0062971 A1* | 3/2018 | Kyosti | H04L 43/50 |
| 2019/0004102 A1* | 1/2019 | Gienger | G01R 29/105 |

OTHER PUBLICATIONS

Spectrum, RF Measurements Using a Modular Digitizer, catalog, United States.
Wikipedia, Phased Array, United States.
Wikipedia, Active Electronically Scanned Array, United States.

* cited by examiner

*Primary Examiner* — Jermele M Hollington
*Assistant Examiner* — Temilade S Rhodes-Vivour
(74) *Attorney, Agent, or Firm* — Naval Air Warfare Center Weapons Division; Jimmy M. Sauz

(57) ABSTRACT

A multi-probe anechoic chamber (MPAC) for beam performance testing of a phased array system, including an active electronically steered array (AESA) system. The MPAC may comprise: an AESA antenna having a plurality of subarrays capable of emitting RF energy; an anechoic chamber having a wall, comprising a plurality of horn antennas for receiving the RF energy; a switch electrically coupled to the horn antennas for selectively coupling of the horn antennas to one or more output channels; various instruments electrically coupled to the output channels for measuring the RF energy; and a processor electrically coupled to the switch and the instruments for controlling the selective coupling of the switch, such that the processor and instruments cooperatively monitor and measure various beam parameters associated with the RF energy. The various beam parameters may include: signal-to-noise ratio, signal strength, beam phase, phase stability, frequency stability, beam shape, beam pointing accuracy, and beam switching rates.

19 Claims, 4 Drawing Sheets

MULTI-PROBE ANECHOIC CHAMBER FOR BEAM PERFORMANCE TESTING OF AN ACTIVE ELECTRONICALLY STEERED ARRAY ANTENNA

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF USE

The present disclosure relates generally to systems and techniques for testing phased array antennas, and more particularly, systems and techniques for beam performance testing of active electronically steered array (AESA) antennas.

BACKGROUND

Antennas may be tested individually or as part of a subsystem or system such as a radar, jammer, or aircraft. Antenna testing is generally conducted in an anechoic chamber due to its compactness and ability to eliminate interference from other nearby radio frequency (RF) sources. These tests are also typically performed to verify antenna performance and to measure various beam characteristics and parameters such as power, signal fidelity, beam shape, beam polarization, beam pointing accuracy, and beam scan or switching rates.

For mechanically-steered, single-antenna or single beam systems, these antennas generally do not require complex test setups. A single antenna, for example, may be tested using a single probe antenna or element, which may be mounted on a wall or support within an anechoic chamber. The single probe antenna then receives RF energy emitted by the antenna under test (AUT) by rotating or repositioning the AUT in azimuth and elevation via a positioner.

Recently, conventional single-beam antennas have been replaced by AESA antennas due to their superior performance. AESA antennas may be mounted in a forward-looking boresight configuration or a side-looking configuration within the radome, and unlike single-, mechanically-steered antennas, AESA antennas generally comprise a two-dimensional (2D) array of antenna elements that may be controlled electronically rather mechanically. The array of antenna elements, while being stationary at a fixed location, can point and direct one or more beams in different directions simultaneously and radiate or receive different signals at different frequencies. Multiple beams are also generally produced by dividing the 2-D array of elements into subsets of elements or subarrays with each subarray being independently controlled from the other subarrays. By adjusting the phase differences between the antenna elements, the array structure of an AESA antenna can remain fixed, while the RF energy emitted by the antenna array can be steered electronically over a large range of angles.

While AESA antennas are generally more versatile than single-beam antennas, thorough testing of AESA antenna systems is usually more complex. In particular, AESA antennas can generate multiple independent simultaneous beams, which can switch rapidly at different directions and between different polarization states. These beams can also be static or dynamic—that is, stationary or sweeping in azimuth or elevation. In fact, sweeping may occur in small, incremental steps, such that the beams appear to be moving uniformly.

Additionally, closed-loop testing where the AUT is integrated with other systems in a hardware-in-the-loop simulation may produce dynamic, nondeterministic beam movement. This generally involves beam pattern testing without knowledge as to the specific direction or location of any beam. As a result, a single probe antenna is generally insufficient to measure the behavior of multiple beams generated by an AESA system.

Furthermore, broadband signals emitted by AESA systems may be limited when transmitted at different angles. Beam steering is usually based on phase, and phase is frequency dependent. Thus, beam pointing is strictly narrowband, thereby affecting the shape of broadband beams, as the direction of the beams is changed (i.e., beam squint). The broadband signals generated by an AESA antenna may also be distorted at larger angles. Therefore, a complete characterization of an AESA antenna or AESA system generally requires additional testing tailored to AESA systems.

Accordingly, based on the foregoing, a need exists for a test system that can be used to test phased array antennas, including AESA antenna systems. A further need exists for reducing the complexity, time, and effort associated with AESA antenna testing.

SUMMARY OF ILLUSTRATIVE EMBODIMENTS

To minimize the limitations in the related art and other limitations that will become apparent upon reading and understanding the present specification, the following discloses embodiments of a new and useful multi-probe anechoic chamber (MPAC) for beam performance testing of an active electronically steered array (AESA) system.

One embodiment may be an MPAC for beam performance testing of a phased array system, the MPAC comprising: a phased array antenna having a plurality of subarrays configured to emit radio frequency (RF) energy; a plurality of probe antennas for receiving the RF energy; a switch electrically coupled to the plurality of probe antennas for selectively coupling the plurality of probe antennas to one or more output channels; one or more instruments electrically coupled to the one or more output channels for detecting and measuring the RF energy emitted from the phased array antenna; and a processor electrically coupled to the switch and the one or more instruments for controlling the selective coupling of the switch, such that the processor and the one or more instruments may cooperatively monitor and characterize one or more beam parameters associated with the RF energy. The processor and the one or more instruments may be further configured to cooperatively map the RF energy to the plurality of probe antennas to identify associated probe antennas receiving the RF energy, such that the processor may determine beam shape and beam pointing accuracy. The beam parameters may be derived from a group of beam parameters including: signal-to-noise ratio (SNR), signal strength, phase stability, frequency stability, and beam switching rates. The processor and the one or more instruments may be configured to cooperatively perform closed loop testing. The switch may be electrically coupled to N probe antennas being spatially separated and equidistant to each other, where N is a positive integer that may be greater than or equal to two and may be determined, based, at least in part, on a frequency of the RF energy. The MPAC may further comprise a digitizer configured to digitize the RF energy into a digitized RF signal. The plurality of probe antennas may be horn antennas. The plurality of probe antennas may be arranged in a plurality of rows and a plurality of columns, thereby forming an antenna array in a rectangular arrangement. The phased array antenna may be an AESA antenna.

Another embodiment may be an MPAC for beam performance testing of an AESA system, the MPAC comprising: an AESA antenna having a plurality of subarrays configured to emit an RF energy; an anechoic chamber having at least one wall with a plurality of probe antennas adapted to receive the RF energy; a switch electrically coupled to the plurality of probe antennas for selectively coupling the plurality of antenna probes to one or more output channels; one or more instruments electrically coupled to the one or more output channels and configured to detect and measure the RF energy of the AESA antenna; and a processor electrically coupled to the switch and the one or more instruments for controlling the selective coupling of the switch, such that the processor and the one or more instruments cooperatively monitor and characterize one or more beam parameters associated with the RF energy. The processor and the one or more instruments may be further configured to cooperatively map the RF energy to the plurality of probe antennas to identify associated probe antennas receiving the RF energy, such that the processor may determine beam shape and beam pointing accuracy. The beam parameters may be derived from a group of beam parameters including: SNR, signal strength, phase stability, frequency stability, and beam switching rates. The processor and the one or more instruments may be configured to cooperatively perform closed loop testing. The switch may be electrically coupled to N probe antennas being spatially separated and equidistant to each other, where N is a positive integer that may be greater than or equal to two and may be determined, based, at least in part, on a frequency of the RF energy. The MPAC may further comprise a digitizer for digitizing the RF energy into a digitized RF signal having a digitized RF carrier at a sample rate at or above a Nyquist sampling rate. The plurality of probe antennas may be horn antennas. The plurality of probe antennas may be arranged in a plurality of rows and a plurality of columns, thereby forming an antenna array in a rectangular arrangement.

Another embodiment may be an MPAC for beam performance testing of an AESA system, the MPAC comprising: an AESA antenna having a plurality of subarrays configured to emit an RF energy and an electronic beam steering system for controlling beam formation of the RF energy; an anechoic chamber having at least one wall, comprising a plurality of horn antennas for receiving the RF energy, wherein each of the plurality of horn antennas may comprise two outputs—a horizontal polarization output and a vertical polarization output; a switch electrically coupled to the plurality of horn antennas for selectively coupling the plurality of horn antennas to one or more output channels; one or more instruments electrically coupled to the one or more output channels and configured to detect and measure the RF energy emitted from the AESA antenna; and a processor electrically coupled to the switch and the one or more instruments for controlling the selective coupling of the switch, such that the processor and the one or more instruments may cooperatively monitor and characterize one or more beam parameters associated with the RF energy, in accordance with static measurement testing and dynamic measurement testing; wherein the one or more beam parameters may be derived from a group of beam parameters including: SNR, signal strength, phase, phase stability, frequency stability, beam shape, beam pointing accuracy, and beam switching rates. The switch may be electrically coupled to N horn antennas being spatially separated and equidistant to each other, where N may be a positive integer that is greater than or equal to two and may be determined, based, at least in part, on a frequency of the RF energy. The MPAC may further comprise a digitizer for digitizing the RF energy into a digitized RF signal having a digitized RF carrier at a sample rate at or above a Nyquist sampling rate.

The advantage of the MPAC disclosed herein generally lies in its ability to efficiently and thoroughly test phased array antennas, and in particular, AESA antennas, which are more complex than single-beam antennas. A particular challenge with AESA antennas is the extremely large number of test points that can result from characterizing the beam performance of the AESA antenna. Additionally, the angular dependence of their beam quality with the potential for multiple independent, simultaneous beams (which can switch rapidly at different directions and between different polarization states) leads to an exponentially increasing number of test points required to thoroughly characterize a system using an AESA antenna. Thus, the traditional single-probe element approach of one measurement at a time can lead to an indefinite amount of time required for thorough testing. As such, the MPAC described herein employs an array of probe antennas covering an entire chamber wall, a processor, and one or more instruments, all of which cooperate to characterize beam patterns of the phased array antenna system. The probe antennas are cooperatively switched via the processor to enable significant time savings by automating some of these measurements. This enables parallel testing of multiple simultaneous beams, thereby substantially reducing the amount of time for testing. The MPAC may also be configured for beam tracking during dynamic testing and closed loop testing.

It is an object to provide an MPAC that efficiently conducts antenna tests for phased array antennas, including AESA systems. The MPAC is preferably capable of receiving multiple beams emitted from the phased array antenna simultaneously, even if the beams are static or dynamic (i.e., sweeping in azimuth or elevation).

It is an object to provide an MPAC that can scan multiple beams that switch rapidly at different directions and different polarization states.

It is an object to provide an MPAC with multiple test points for testing phased array antennas with an increased number of degrees of freedom.

It is an object to provide an MPAC capable of performing closed loop testing where the unit under test is integrated with other systems in a hardware-in-the-loop simulation and requires dynamic, nondeterministic beam movement (i.e., the specific beam direction during testing is unknown previously but must be determined in real time).

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

The drawings are illustrative embodiments. They do not illustrate all embodiments. They do not set forth all embodiments. Other embodiments may be used in addition or instead. Details, which may be apparent or unnecessary, may be omitted to save space or for more effective illustration. Some embodiments may be practiced with additional components or steps and/or without all of the components or steps, which are illustrated. When the same numeral appears in different drawings, it is intended to refer to the same or like components or steps.

DETAILED DESCRIPTION OF ILLUSTRATIVE EMBODIMENTS

Figure 1:
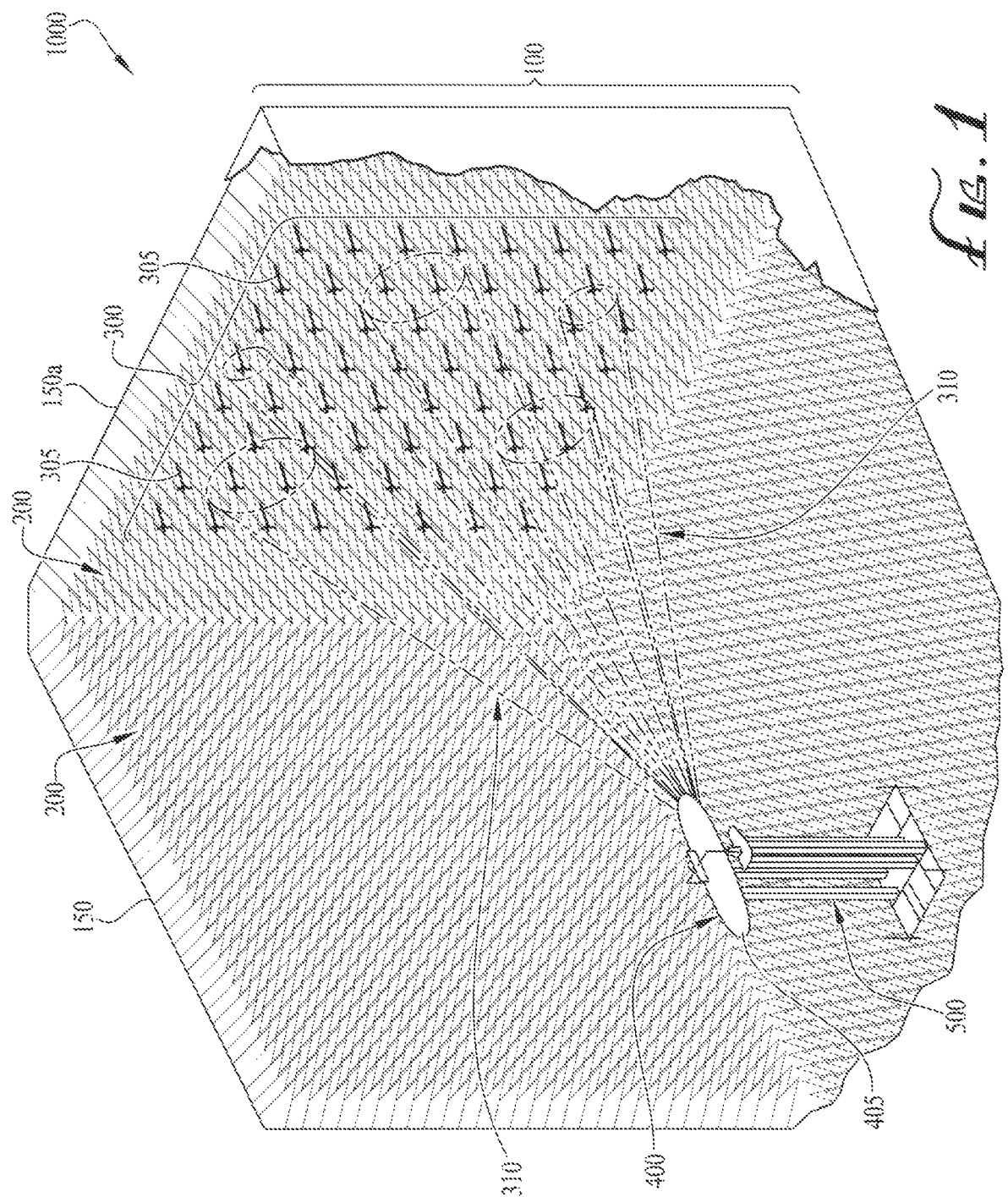
FIG. 1 is a perspective view of one embodiment of a multi-probe anechoic chamber (MPAC) for beam performance testing of an active electronically steered array (AESA) system.

In the following detailed description, numerous specific details are set forth in order to provide a thorough understanding of various aspects of one or more embodiments of the multi-probe anechoic chamber (MPAC) for beam performance testing of an active electronically steered array (AESA) system. However, these embodiments may be practiced without some or all of these specific details. In other instances, well-known methods, procedures, and/or components have not been described in detail so as not to unnecessarily obscure the aspects of these embodiments.

Before the embodiments are disclosed and described, it is to be understood that these embodiments are not limited to the particular structures, process steps, or materials disclosed herein, but is extended to equivalents thereof as would be recognized by those ordinarily skilled in the relevant arts. It should also be understood that the terminology used herein is used for the purpose of describing particular embodiments only and is not intended to be limiting.

Reference throughout this specification to "one embodiment," "an embodiment," or "another embodiment" may refer to a particular feature, structure, or characteristic described in connection with the embodiment of the present disclosure. Thus, appearances of the phrases "in one embodiment" or "in an embodiment" in various places throughout this specification may not necessarily refer to the same embodiment.

Furthermore, the described features, structures, or characteristics may be combined in any suitable manner in various embodiments. In the following description, numerous specific details are provided, such as examples of materials, fasteners, sizes, lengths, widths, shapes, etc. . . . to provide a thorough understanding of the embodiments. One skilled in the relevant art will recognize, however, that the scope of protection can be practiced without one or more of the specific details, or with other methods, components, materials, etc. . . . In other instances, well-known structures, materials, or operations are generally not shown or described in detail to avoid obscuring aspects of the disclosure.

Definitions

In the following description, certain terminology is used to describe certain features of the embodiments of the MPAC for beam performance testing of an AESA system. For example, as used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "approximately" may refer to a range of values of ±10% of a specific value.

As used herein the term "somewhat" refers to a range of values of ±50% of a specific value.

As used herein, the term "about" is used to provide flexibility to a numerical range endpoint by providing that a given value may be "a little above" or "a little below" the endpoint. In some cases, the term "about" is to include a range of not more than about two inches of deviation.

By way of illustration, a numerical range of "about 1 inch to about 5 inches" should be interpreted to include not only the explicitly recited values of about 1 inch to about 5 inches, but also include individual values and sub-ranges within the indicated range. Thus, included in this numerical range are individual values such as 2, 3, and 4 and sub-ranges such as from 1-3, from 2-4, and from 3-5.

This same principle applies to ranges reciting only one numerical value and should apply regardless of the breadth of the range or the characteristics being described.

As used herein, the term "electromagnetic radiation" refers to energy emanating from oscillation of transverse electric and magnetic fields. Electromagnetic radiation is generally characterized by a wave of disturbance of wavelength, $\lambda$, which is the distance between peaks of the wave and its frequency, which may be the number of occurrences the wave returns to its original displacement per unit time as it passes a fixed point. Electromagnetic radiation may include, without limitation, electromagnetic fields and electromagnetic signals such as radar, radio frequency (RF) signals, RF energy, and microwave energy.

As used herein, the terms "radio frequency" and "RF" refers to any of the electromagnetic wave frequencies that lie in the range extending from around 3 kHz to 300 GHz, which include those frequencies used for communications or radar signals.

As used herein, the term "radiation axis" refers to a fixed reference line to which electromagnetic radiation travels. For example, the radiation axis may be the reference path to which electromagnetic radiation travels and reflects from the centerline or center direction of an antenna element.

As used herein, the term "memory" generally refers to a computer-readable storage medium capable of storing computer instructions or compute code for the execution of one or more processors. Memory may refer to one or more memories or memory devices and may be distributed amongst multiple processors.

As used herein, the term "processor" refers to one or more devices, circuits, and/or processing cores configured to process data, such as computer program instructions. The term "processor" shall broadly refer to and is not limited to a single- or multi-core general purpose processor, a special purpose processor, a conventional processor, a Graphics Processing Unit (GPU), a digital signal processor (DSP), a plurality of microprocessors, one or more microprocessors in association with a DSP core, a controller, a microcontroller, one or more Application Specific integrated Circuits (ASICs), one or more Field Programmable Gate Array (FPGA) circuits, any other type of integrated circuit (IC), a system-on-a-chip (SOC), and/or a state machine.

As used herein, the terms "phased array" and "phased array antenna" generally refer to a computer-controlled or processor-controlled array of antennas capable of generating a beam of radio waves that can be electronically steered in different directions without physically moving the antennas and includes, without limitation, passive electronically steered array (PESA), active electronically steered array (AESA), and conformal antennas.

As used herein, the terms "passive electronically steered array" or "PESA" generally refer to a phased array where the antenna elements are coupled to a single transmitter and/or receiver. PESA antennas can only emit a single beam of radio waves at a single frequency at a time.

As used herein, the terms "active electronically steered array" or "AESA" generally refer to a phased array in which each antenna element has its own transmitter/receiver unit, all controlled by a processor or computer. Unlike PESAs, AESA are generally capable of radiating multiple beams of radio waves at multiple frequencies in different directions simultaneously.

As used herein, the term "conformal antenna" generally refers to a phased array having individual antennas mounted on a curved surface rather than a flat plane. Here, the phase shifters may compensate for the different path lengths of the waves due to the antenna elements' varying position on the surface, thereby allowing the array to radiate a plane wave.

Distances, forces, weights, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

This same principle applies to ranges reciting only one numerical value and should apply regardless of the breadth of the range or the characteristics being described.

As used herein in this disclosure, the singular forms "a" and "the" may include plural referents, unless the context clearly dictates otherwise.

The present disclosure relates generally to antenna testing, and more particularly, to systems and methods for conducting antenna testing for phased array antennas, including AESA antennas. In general, single antenna systems are typically conducted in an anechoic chamber due to its compactness and ability to eliminate interference from nearby RF systems. These tests typically involve using a single probe antenna such as a probe horn and are typically performed to verify antenna performance and measure various beam parameters.

The single probe antenna, which may be mounted on a wall or support within the anechoic chamber, may receive the electromagnetic or RF energy emitted by the antenna under test (AUT) by moving or repositioning the AUT in azimuth and elevation via a positioner.

AESA antennas, however, are much more versatile than single antenna legacy systems. AESA antennas generally comprise a two-dimensional (2D) array of antenna elements that may be controlled electronically rather mechanically. In particular, by adjusting the phase differences between the antenna elements, the array structure of an AESA antenna can remain fixed, while the antenna beams can be steered electronically over a large range of angles.

Since AESA antennas are generally more versatile than single-beam antennas, antenna testing of AESA systems is usually more complex. AESA antennas can generate multiple independent simultaneous beams, which can switch rapidly at different directions and between different polarization states. Additionally, closed-loop testing for AESA antennas generally involves beam pattern testing without prior knowledge of a specific direction or location of the radiated beam(s). Thus, a single probe antenna for detecting and measuring beam patterns and wave emissions is generally insufficient to measure the behavior of multiple beams generated by an AESA system.

Accordingly, the embodiments disclosed herein solve this problem by utilizing a plurality of probe antennas such as probe horns to serve as test points. The probe antennas or probe horns are selectively and electrically coupled to a processor and one or more equipment or instruments, and the processor may cooperate with a switch and the equipment in order measure and characterize various beam parameters. Given that each beam can also function independently of and simultaneously with the other beams, the beams can be electronically steered both continuously and in near instantaneous switching between different directions. Thus, the embodiments may perform various testing, including dynamic testing or closed loop testing.

Importantly, unlike other multi-probe test configurations, embodiments of the MPAC disclosed herein are configured to perform beam testing on phased array antennas. As discussed above, phased array antennas, including AESA and PESA systems, are generally capable of electronic steering in different directions without movement of the physical antennas. While conventional multi-probe test systems have been used for testing mobile devices and other wireless systems, these wireless systems generally have a multiple input multiple output (MIMO) configuration, and thus, generally utilize multi-probe over-the-air (OTA) MIMO testing. This type of testing, however, is directed to wireless devices incapable of electronic steering in different directions such as those used by phased array antennas. As such, conventional multi-probe test setups require a predetermined arrangement and number of active probe antennas in the MPAC, which is typically based at least in part on a simulation modeled by a computer beforehand.

Embodiments of the MPAC disclosed herein are also not generally directed to user equipment (e.g., mobile cellular phones) and wireless systems utilizing MIMO configurations (e.g., cellular base stations). Such devices and systems generally deal with modulation techniques to overcome multipath propagation and Doppler effects such as orthogonal frequency-division multiplexing (OFDM) techniques.

In the accompany drawings, like reference numbers indicate like elements. Reference character 1000 depicts embodiments of the MPAC for beam performance testing of a phased array, and in particular, an AESA system.

FIG. 1 is a perspective view of one embodiment of an MPAC 1000 for beam performance testing of an AESA system. As shown in FIG. 1, one embodiment of the MPAC 1000 may comprise an anechoic chamber 100 having walls 150, 150*a* lined with absorber material 200, wherein at least one wall 150*a* may comprise a two-dimensional array 300 of probe antennas 305. Exemplary embodiments of the probe antennas 305 are preferably spatially arranged and equidistant to each other and may prominently face in the general direction of the AUT head on. In other embodiments, the spacing between the probe antennas 305 may vary, such that the probe antennas 305 may be concentrated at a particular area of the wall 150*a*, elevation, or range of elevations. Although FIG. 1 depicts a single wall having an array of probe antennas 305, other embodiments of the MPAC may include multiple walls with multiple arrays 300 of probe antennas 305.

In accordance with multiple embodiments, the configuration of the probe antennas 305 may be static, such that the selection and arrangement of the probe antennas 305 are arranged and configured prior to beam performance testing. This allows the MPAC 1000 to perform various types of testing including closed-loop testing, which involves beam direction behavior that is stochastic—that is, the beam direction cannot be predicted prior to testing. Conventional multi-probe antenna configurations, on the other hand, might utilize a dynamically-selected or semi-statically selected configuration of probe antennas 305, These conventional multi-probe antenna configurations generally require a computer to simulate or run channel modeling software to determine antenna array beam patterns in order to construct a multi-probe antenna configuration for OTA MIMO testing, which generally involves modulation techniques to overcome multipath propagation. Based on the simulation, the relative differences in beam power and weight may be observed to determine a preselected multi-probe antenna configuration. A composite reference channel model may be generated to optimize a probe antenna configuration beforehand. Unlike these conventional multi-probe antenna test setups, exemplary embodiments of the MPAC 1000 disclosed herein preferably do not utilize a dynamically-selected or semi-statically multi-antenna probe configuration.

FIG. 1 also shows that the MPAC 1000 may comprise a pod 400 containing the AUT, which is preferably a phased array antenna such as an AESA antenna 410 (shown in FIG. 2) or PESA antenna. The pod 400 may comprise a pod housing 405 preferably constructed of radome material (or any material that minimally attenuates the electromagnetic signals transmitted or received by the AUT). The pod 400 may also be coupled to or mounted on a positioner 500 capable of repositioning or rotating the pod 400 in azimuth and elevation. In other embodiments, rather than a positioner 400, the pod 400 or AUT may remain stationary on a standalone support structure. Although FIG. 1 depicts a pod 400 containing an AUT, antenna testing may also be conducted directly with the AUT and without a pod 400 or pod housing 405.

Importantly, FIG. 1 shows the pod 400 emitting multiple beams 310, which may be intercepted by the array 300 of probe antennas 305. Here, the phased array antenna, which is preferably an AESA antenna 410, may transmit multiple simultaneous beams 310 of electromagnetic energy in the RF frequency band or microwave band; thus, requiring multiple test points to intercept the beams 310. As a result, the beams 310 may be received by the static array 300 of probe antennas 304. Given that the beams 310 may be electronically steered without physical movement of the AUT, the beam emissions of the phased array antenna do not require test methods and techniques that overcome errors relating to multipath propagation and Doppler effects. As such, embodiments of the AUT and MPAC 1000 do not preferably utilize OFDM techniques where several separate narrowband channels are split at different frequencies to reduce interference and crosstalk between the channels. Such OFDM techniques and information may employ beam weighting for selectively controlling array beam patterns for antenna arrays, which is distinct and not utilized by the embodiments of the MPAC 1000 disclosed herein.

FIG. 1 shows that the probe antennas 305 may be mounted on the chamber wall 150*a*, but alternative embodiments of the MPAC 1000 may utilize a support structure for supporting the array 300 of probe antennas 305 in lieu of the wall 150*a*. Each probe antenna 305 may be electrically coupled to a switch 600 (shown in FIG. 4) via cabling such as coaxial cables 306, 307 (shown in FIG. 4), and the coaxial cables 306, 307 may be routed behind the absorber material 200 on the chamber wall 150*a*. Each beam 310 can be detected and tracked with other beams 310 simultaneously via RF instruments by switching the particular probe antennas 305 to the appropriate dynamic testing instrument(s) 900 or static testing instrument(s) 950. Examples of such instruments may include receivers, power meters, oscilloscopes, spectrum analyzers, and various equipment to perform measurements such as power, polarization, beam size, and beam direction. Additional details of the instruments contemplated for use by the MPAC 1000 are discussed below in FIG. 4.

Given that the AUT is capable of transmitting multiple beams 310 simultaneously, embodiments of the MPAC 1000 are preferably configured to capture and receive much of the incoming radiation head-on at different locations simultaneously. Thus, multiple test points, which may be achieved by utilizing the array 300 of probe antennas 305 is preferably implemented. Although static testing of an AUT emitting multiple beams 310 can be performed utilizing a single probe antenna 305 in principle, this would generally require that the AUT or pod 400 be repositioned and rotated such that each beam 310 is directed towards the probe antenna 305, which is time-consuming and inefficient. Therefore, in order to conduct antenna testing on a phased array antenna quickly and efficiently (especially in an environment where a large number of measurements must be made within a reasonable period of time), a large number of probe antennas 305 is generally needed.

In an exemplary embodiment, the probe antennas 305 may be horn antennas, which are antennas having a flaring metal waveguide shaped like a horn or pyramid for receiving or directing radio waves in a beam. The flared portion can be square, rectangular, or conical and is usually fed with a wave guide. The size of the horn antenna is preferably designed to accommodate the size relative to the wavelength of the incoming or outgoing electromagnetic signal; otherwise, if the horn antenna is too small or the wavelength is too large (i.e., frequency is too low), the horn antenna may not function efficiently.

Additionally, each probe antenna 305 may comprise two outputs to accommodate vertical and horizontal polarization. Thus, each probe antenna 305 generally requires a pair of coaxial cables 306, 307, and the switch 600 must be sufficiently large to accommodate pairs of cabling from each probe antenna 305. Further, the number of outputs from the switch 600 may depend on the number of simultaneous measurements required.

FIG. 1 also shows that the array 300 of probe antennas 305, when mounted on the wall 150*a* of the anechoic chamber 100, may be spatially separated and equidistant to each other. In other embodiments, the spacing between the probe antennas 305 may vary. For example, multiple embodiments of the probe antennas 305 may be concentrated at or near a particular height or elevation in order for the probe antennas 305 to focus electromagnetic transmission at that elevation. This may result with few probe antennas 305 outside that particular elevation such as the upper and lower portions of the wall 150a.

The probe antennas 305 may also be arranged in multiple rows and multiple columns, thereby forming the antenna array 300 in a rectangular arrangement. The probe antennas 305, for example, may be arranged to form a square pattern, but other patterns may be contemplated. Any possible performance gain, however, for different patterns (e.g., diamond pattern, trapezoidal pattern) may not sufficiently warrant the additional complexity and cost.

In some embodiments, each probe antenna 305 can be pointed directly at (i.e., the peak response of the probe antenna 305 is aligned with the AUT, which is fixed in space). This enables each probe antenna 305 to operate at its peak gain; otherwise, the beam 310 may intersect the probe antenna 305 at an angle that is not aligned with its maximum gain angle. As a result, this may produce an angle dependent loss which may complicate the interpretation of data.

Regarding the number of probe antennas 305 implemented with the MPAC 1000, the number of probe antennas 305 is usually implementation dependent, and therefore, the inventive principles and concepts are not limited to any particular antenna array or structure. However, in general, the number of probe antennas 305 may be affected by the angular resolution and frequency range for which the anechoic chamber 100 was designed. Specifically, for signal transmissions at lower frequencies, the beams 310 are generally wider; thus fewer probe antennas 305 are generally needed to intercept beams 310 at any direction, resulting with sparse antenna spacing. Beams 310 transmitted at much higher frequencies, on the other hand, are generally narrower, and thus, require more probe antennas 305 to intercept the beams 310 (i.e., densely-spaced antenna configuration). For signal transmissions at an upper frequency range, the beams 310 or wave emissions might be so narrow, such that the beams 310 must be pointed near or adjacent to the probe antenna 305 in order to be received. Accordingly, the optimum number and arrangement of probe antennas 305 is generally based on the frequency of the signal transmissions and design unique to each anechoic chamber 100.

Regarding the dimensions of the anechoic chamber 100, various shapes and designs may be considered, but a preferred embodiment of the anechoic chamber 100 may be a square chamber rather than an elongated chamber. Elongated or rectangular chambers are generally characterized as having a high level of reflection of the low-angle incident radiation, which may alter the uniformity of an incident waveform. Thus, the embodiments of the anechoic chamber 100 disclosed herein are preferably square in shape in order to prevent or minimize interference from unwanted RF energy emissions. The size and shape of the anechoic chamber 100 may also affect the number and arrangement of probe antennas 305 used by the MPAC 1000. When performing antenna testing, the pod 100 or AUT (i.e., phased array antenna) may be located at one end of the anechoic chamber 100, whereas the probe antennas 305 may be disposed at the opposing end.

Preferably, the outer surface or shell of the anechoic chamber 100 may be constructed of a metal such as sheet metal to neutralize ambient radiation and may be lined with the absorber material 200. Efficient absorption by the absorber material 200 may be achieved by utilizing pyramidal or conical projections but may be constructed with multilayered slabs. The absorber material 200 is also preferably impregnated with lossy carbon or other conductor adapted to absorb electromagnetic radiation in the RF frequency or microwave range, and the resistance loading field of the pyramidal layered absorber should taper gradually to match the impedance of the wall surface with the very high impedance of free space.

When testing AESA antennas 410, the antenna testing generally requires fast, computer-controlled switching. AESA antennas 410 are generally capable of transmitting beams 310 that can be electronically steered both continuously and in near instantaneous switching at different directions. Each beam 310 can also function independently from other beams 310. Thus, the two dimensional multi-probe arrangement of the probe antennas 305 preferably enables multiple simultaneous dynamic measurements, especially for closed loop testing.

By way of example, when the phased array antenna performs a closed loop operation, beam direction may be stochastic—i.e., the beam direction cannot be predicted prior to testing. Given that multiple beams 310 may be transmitted by the phased array antenna, it may be virtually impossible to use prepositioned probe antennas 305. Thus, by increasing the number of test points or probe antennas 305 within the anechoic chamber 100, the MPAC 1000 may track various directions of beams 310 and therefore perform closed loop testing, as desired.

Figure 2:
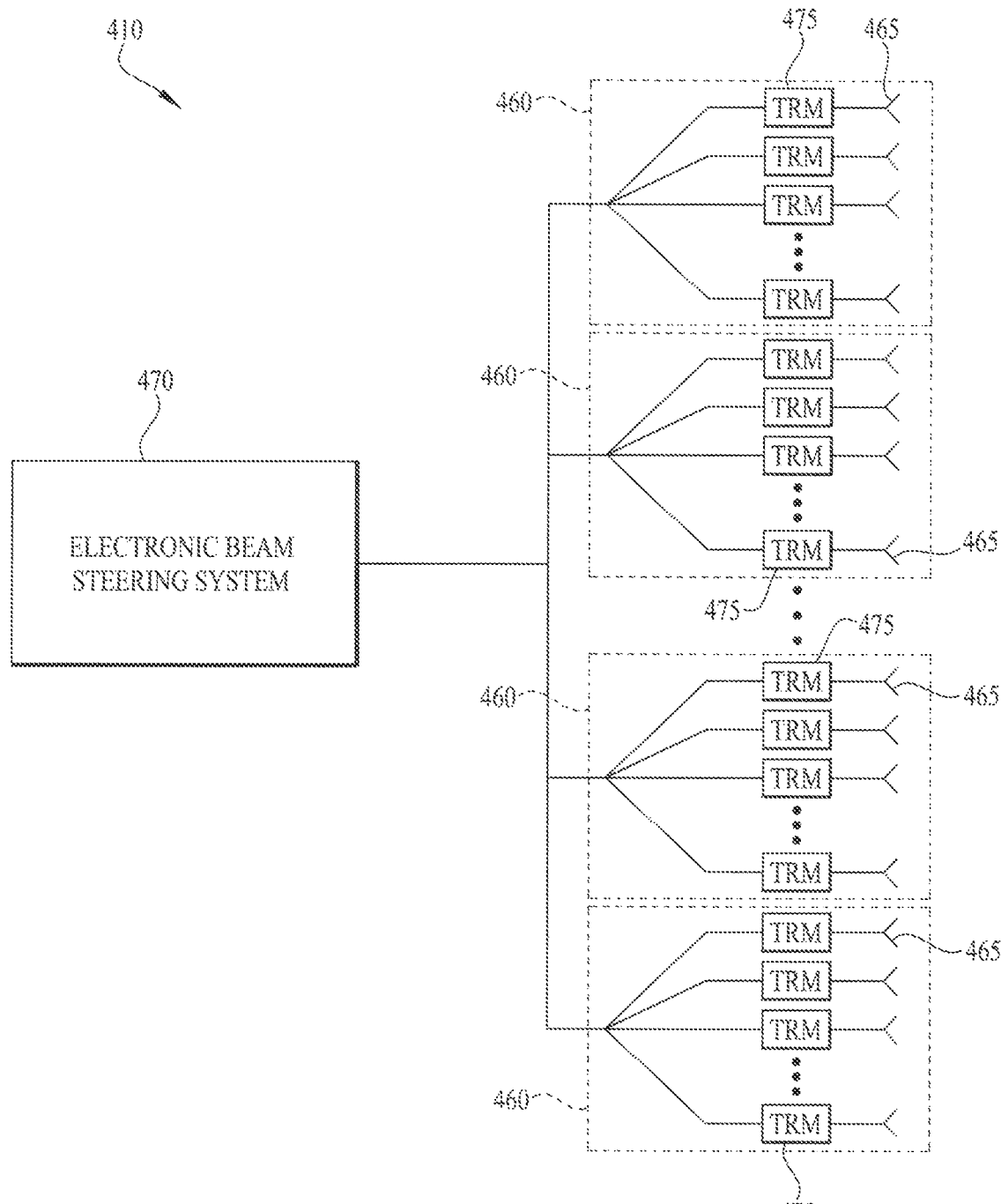
FIG. 2 is a block diagram of one embodiment of a phased array antenna, and more particularly, an AESA antenna.

FIG. 2 is a block diagram of one embodiment of a phased array antenna, and more particularly, an AESA antenna 410. As discussed above, the AESA antenna 410 may be disposed within the pod 400 and is preferably configured to transmit one or more beams 310 of radio waves 481 (shown in FIG. 3). The AESA antenna 410 is also preferably capable of steering the beams 310 of radio waves 481 to various directions without physical movement of the antenna elements 465. The AESA antenna 410 may comprise: multiple subarrays 460 and an electronic beam steering system 470, and each subarray 460 may further comprise antenna elements 465 and small solid-state transmit/receive modules (TRM) 475. The subarrays 460 may be controlled independently or in concert for RF detection or communications.

The electronic beam steering system 470 preferably controls the direction to which the beams 310 of radios waves 481 propagate by emitting separate radio waves 481 from each TRM module 475 and constructively interfering at certain angles in front of the antenna elements 465. Unlike PESA systems, AESA systems can spread their signal emissions across a band of frequencies, making it difficult to detect over background noise and allowing ships and aircraft to broadcast powerful radar signals while still remaining stealthy. AESA systems are often developed for use in RF communications when multiple frequency bands are used. Additional details in describing the electronic steering of radio waves 481 are discussed in FIG. 3 below.

Figure 3:
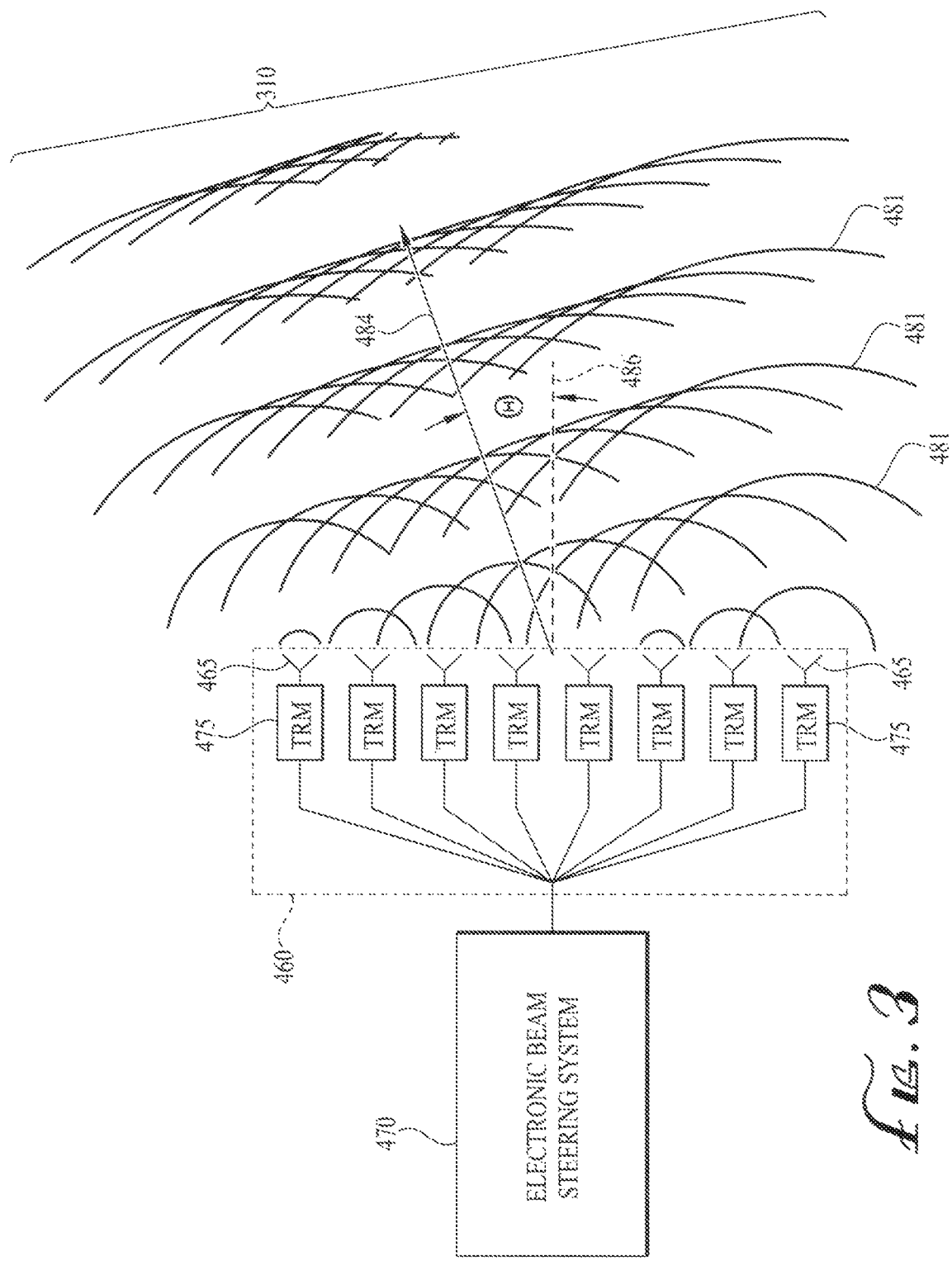
FIG. 3 is an illustration of one embodiment of an electronic beam steering system and a single subarray of the AESA antenna and shows the subarray in operation on a single dimension.

FIG. 3 is an illustration of one embodiment of an electronic beam steering system 470 and a single subarray 460 of the AESA antenna 410 and shows the subarray 460 in operation on a single dimension. As shown in FIG. 3, one embodiment of the subarray 460 may comprise antenna elements 465, TRMs 475 electrically coupled to the antenna elements 465, and an electronic beam steering system 470, which may be computer-controlled. Each subarray 460 may be capable of electronically steering a beam 310 of radio waves 481 to different directions without mechanical movement, and the electronic steering may be performed by the electronic beam steering system 470.

Importantly, FIG. 3 shows how each subarray 460 may electronically steer the beams 310 of radio waves 481 emitted by each antenna element 465. Individual wavefronts of each radio wave 481 are generally spherical but may combine or superimpose in front of the antenna elements 465, at a distance known as the far field, to create a plane wave or beam 310 of radio waves 481 travelling in a specific direction. The electronic beam steering system 470 preferably controls the phase shifts of each antenna element 465 via the TRMs 475 and usually delays the radio waves progressively along the radiation axis 484 of each antenna element 465. In this manner, each antenna element 465 may emit its wavefront later than the one below it, thereby directing the resulting plane wave at an angle θ to the antenna's axis 486. Thus, by adjusting the phase shifts, the electronic beam steering system 470 may instantaneously change the angle θ of the beam 310 of radio waves 481. Unlike a linear array of antennas shown in FIG. 3, phased array antenna, including AESA antennas 410, generally comprise a two-dimensional arrays of antennas. Thus, the resulting beam 310 of radio wave 481 can be steered in two dimensions, rather than, a single dimension shown in FIG. 3.

Figure 4:
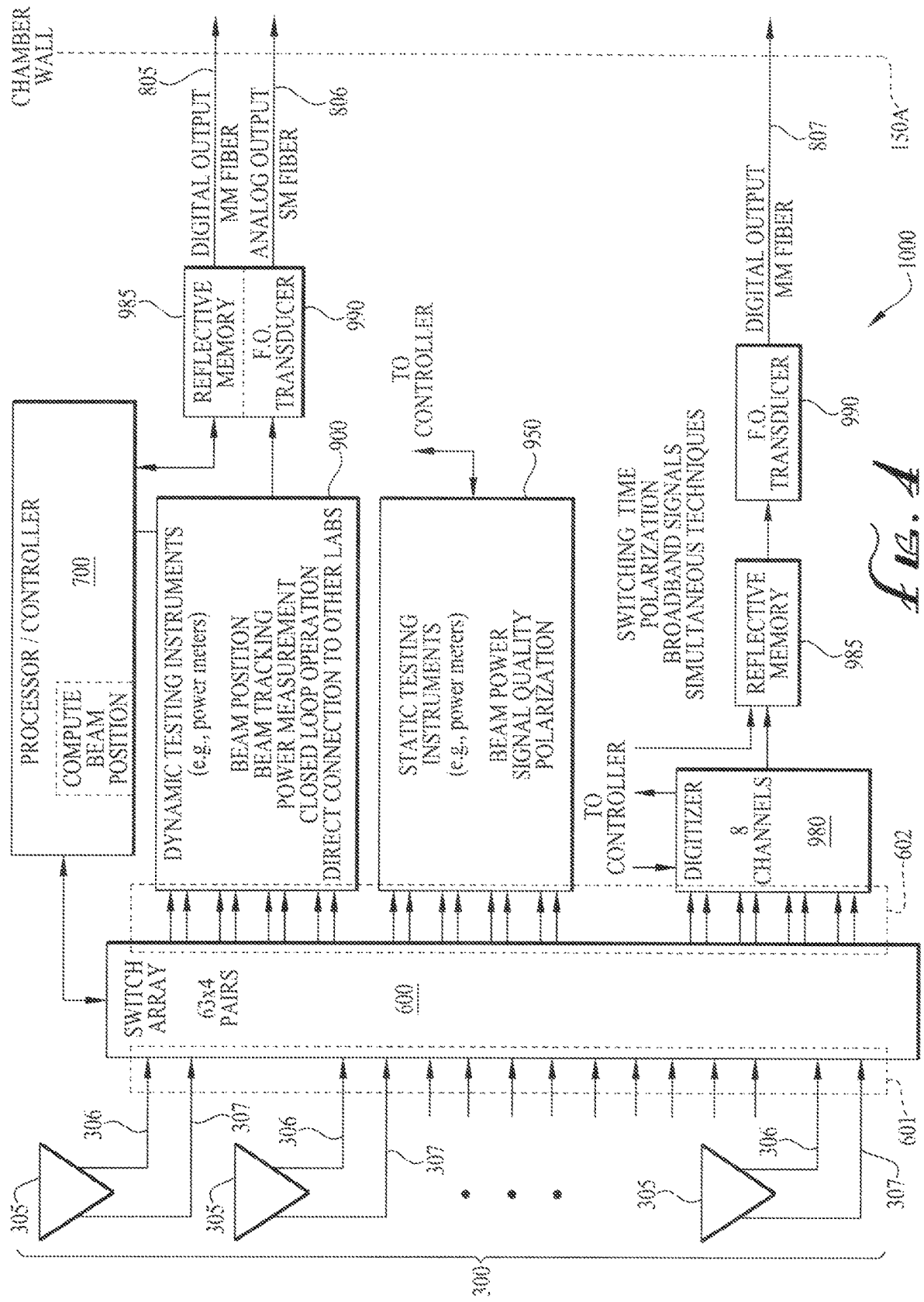
FIG. 4 is a block diagram of multiple embodiments of the MPAC for beam performance testing of the AESA system.

FIG. 4 is a block diagram of multiple embodiments of the MPAC 1000 for beam performance testing of the AESA system. As shown in FIG. 4, one embodiment of the MPAC 1000 may comprise multiple probe antennas 305, a switch 600 electrically coupled to the probe antennas 305, a processor 700, optical fiber cables 805, 806, 807, dynamic testing instruments 900, static testing instruments 950, and a digitizer 980.

As discussed above, embodiments of the probe antennas 305 may be probe horn antennas, and the array 300, shown on the left of FIG. 4, may be electrically coupled to a switch 600 via two cables 306, 307—i.e., one for horizontal polarization; another for vertical polarization. The number of input ports 601 of the switch 600 therefore should accommodate the number of pair of cables 306, 307 for each probe antenna 305. The number of output channels 602 of the switch 600, on the other hand, may depend on the number of signals being simultaneously processed as well as the associated cost of the switch 600. In this manner, the switch 600 may selectively couple or associate the appropriate probe antenna 305 to a particular dynamic testing instrument 900 and/or static testing instrument 950, as needed in order to perform the desired measurement.

In a preferred embodiment, the switch 600 may be configured in a blocking arrangement, such that each probe antenna 305 may be connected to only one switch at a time. For example, one embodiment the switch 600 and probe antennas 305 may have a configuration, comprising sixty-three pairs of inputs and four pairs of outputs. Each pair of inputs may correspond to one of the sixty-three probe antennas 305 in a 4×4 array, whereas each of the four pairs of outputs may be designated for a particular instrument (i.e., dynamic testing instrument(s) 900, static testing instrument(s) 950) or digitizer 980. However, other array structures may be used, as will be understood by those skilled in the art.

FIG. 4 also shows that antenna testing of the MPAC 1000 may be controlled by the processor 700. In particular, the processor 700 may control the selective switching of the switch 600, such that the processor 700 may selectively couple various probe antennas 305 with one or more associated test instrument. In this manner, the processor 700 may cooperate its processing functions with predetermined dynamic testing instrument(s) 900 and/or static testing instrument(s) 950. In various embodiments, the processor 700 may be physically located inside the anechoic chamber 100 or in a control room (not shown). Various embodiments of the processor 700 may also be configured to enable either manual or automated switch operation. Manual switch operation, for instance, may allow a user or operator to manually select specific probe antennas 305 for static measurements (or dynamic measurements if the beam behaviors are known). Automated switch operation, on the other hand, may be needed for closed loop testing, given the extreme difficulty in determining the exact beam direction(s) prior to a simulated antenna test. In other embodiments, automated switching operation may be used to select a series of predetermined probe horns based on a preplanned series of beam positions in near or real time without operator intervention.

In an exemplary embodiment, the processor 700 may also perform preprogrammed simultaneous computations required for operation of the MPAC 1000. Examples of such operations may include calculating and determining beam location, beam tracking, data collection and processing. Although FIG. 4 depicts a single processor, several processors or separate embedded computers may be used to perform the various operations and tasks, including switch control.

FIG. 4 also shows various means for transmitting signals throughout and outside the MPAC 1000. For example, FIG. 4 depicts optical fibers 805, 806 penetrating the chamber wall 150a. In other embodiments, coaxial cables may be used, if properly implemented. Additionally, in alternative embodiments, the pairs of cables 305, 306 coupling the outputs of the probe antennas 305 may penetrate the chamber wall 150a instead, such that die dynamic testing instruments 900, static testing instruments 950, digitizer 980, and processor 700 are behind the chamber wall 150a. While coaxial and other tubular cabling may be implemented, optical fibers 800 are preferred. These cables 305, 306 and optical fibers 800 may couple other equipment, instruments, or control rooms for further processing or data collecting.

FIG. 4 also shows that the MPAC 1000 may comprise a digitizer 980. The digitizer 980 may be configured to sample analog signals emitted from the AUT, convert those signals into digital format, and send the digitized sample to a buffer for further analysis and testing. The digitizer 980 is preferably configured to perform timing measurements (e.g., beam switching time, polarization measurements and polarization switching time, adaption to bandwidth variations, and simultaneous techniques) and preferably comprises multiple channels, all of which are preferably synchronized.

Embodiments of the digitizer 980 may accommodate various measurements of the RF and microwave waveforms, and thus, preferably include sufficient bandwidth, sampling rate, resolution, and memory requirements. For example, the digitizer 980 preferably has a bandwidth at least greater than the twice the maximum frequency of the signals, whereas the sample rate of the digitizer 980 is preferably more than twice the highest frequency component of the signal being acquired (e.g., typically 3 to four times larger than the required bandwidth). The resolution of the digitizer 980 may also affect the dynamic range—i.e., ratio of the highest to the lowest signal level the digitizer 980 can handle. In some embodiments, the digitizer 980 may coordinate with a reflective memory 985 for transmitting high sample rate data to equipment such as recorders located outside of the MPAC

1000. In various embodiments, the reflective memory 985 may couple to a fiber optic transducer 990 for converting the electric signals to optical signals. Although FIG. 4 shows the digitizer 980 as a separate unit, other embodiments of the MPAC 1000 may include a processor 700 having a "built-in" digitizer.

Importantly, FIG. 4 depicts dynamic testing instruments 900 and static testing instruments 950 used by the MPAC 1000. In particular, FIG. 4 illustrates that dynamic testing instruments 900 may include power meters for closed loop operation, which may include determination of beam position 910, beam tracking 920, beam power measurements 930, closed loop operation distribution 940, and direct connection to other laboratories/control room 945. Information regarding beam position 910, beam tracking 920, and beam power measurements 930 are detailed below.

Additionally, FIG. 4 depicts static testing instruments 950 used for various static measurements (e.g., power meters), which may include, for example, static technique testing. Static technique testing typically requires data recording using common data recording equipment and methods. Static polarization measurements may be made using pairs of power meters. In some tests, it may be necessary to transmit from a probe antenna 305 or probe horn to the AUT, which requires an appropriate transmitter (not shown), controlled either by the processor 700 or directly from an external fiber optic link. The transmitter would transmit the appropriate power into the switch 600 and to the selected probe antenna 305. Multiple technique testing and simultaneous techniques are also possible.

Finally, regarding cabling and networking, fiber optic (FO) transducers 990 may be implemented to convert the electrical signals into optical signals for signal transmission through optical fibers 805, 806. Analog RF signals may also be transmitted on single mode optical fibers 805, whereas digital data signals may be transmitted on multi-mode (MM) optical fibers 806. As shown in FIG. 4, digital signals may be transmitted via a reflective memory system 985, which may help connect nodes on a network.

The following discloses in detail various static and dynamic measurements performed by the MPAC 1000.

Static Testing and Measurements

Performing static measurements (i.e., a single arrangement of beams is established and remains fixed during the test) on AESA antennas 410 (e.g., power, polarization, signal fidelity) are generally the same as any antenna and does not normally require a large array 300 of probe antennas 305. Static tests of a AESA antennas 410 may be performed with a single-probe antenna 305 by repositioning and rotating the AUT, such that each beam 310 is sequentially pointed at that single-probe antenna 305. Indeed, this single-beam approach is much slower than a parallel approach; thus, the MPAC 1000 may efficiently measure multiple fixed beams 310 simultaneously by increasing the number of test points via fixed probe antennas 305. This would preferably enable multiple simultaneous static measurements in fixed directions.

In order to measure beam RF power, various measuring devices such as power meters, power sensors, spectrum analyzers, or oscilloscopes may be used. Any of these instruments may electrically couple to an output channel 602 of the switch 600 and may measure the beam power or RF power of the beam 310. Because continuous wave signals generally do not carry any information, the average power and peak power are typically the same and the signal generally does not have any bandwidth. The power meter, power sensor, spectrum analyzer, or oscilloscope may also be used to measure signal quality and polarization of the beams 310 emitted from the AUT.

Fixed static measurements (i.e. a fixed or stationary antenna) are generally inadequate for fully testing AESA antennas 410 because of their dependence on a transmit angle. For example, a static measurement of signal fidelity at boresight must be repeated with the beam pointed at other angles because of its dependence on angle. Again, such tests can be carried out with a single probe antenna 305 by rotating the AUT; but with the substantially increased number of test points, the test time will increase accordingly. Fully testing an AESA antenna 410 generally requires the ability to test each beam 310 over its full range of directions. This measurement concept enables testing independent, multiple simultaneous beams 310.

Dynamic Testing and Measurements

Dynamic testing (i.e., utilizing different probe antennas 305 that can be activated to track changing beam positions) may involve testing each beam 310 over its full range of directions in azimuth and elevation, such as beam switching time. The processor 700, which is preferably configured for dynamic testing in a closed loop environment, may select certain probe antennas 305 based on signals detected by the dynamic testing instruments 900. Like the static testing instruments 950, dynamic testing instruments 900 may include power meters, power sensors, spectrum analyzers, or oscilloscopes, all of which may be controlled or electrically associated with the processor 700. Because AESA antennas 410 can be electronically steered, AESA antennas 410 are typically capable of near-instantaneous switching between different directions. Further, each beam 310 can function independently of, and simultaneously with, other beams 310. Therefore, the MPAC 1000 is capable of performing multiple simultaneous dynamic measurements.

A challenging example of performing dynamic measurements occurs when the AUT is controlled by external systems located outside the anechoic chamber 100. In such cases, including closed loop operation, the beam direction may be stochastic—that is, its exact position in time cannot be predicted prior to the test. Here, the exact position of the beam(s) is controlled remotely, changes in time, and is not known beforehand. Rather, the beams must be tracked and the appropriate probe horns must be switched on at the appropriate times. Thus, the MPAC 1000 is preferably capable of performing this beam tracking during external control including closed loop testing.

Beam Position Measurements

One test for AESA antennas 410 is to verify that a prior estimation of an actual beam direction coincides with the expected direction. This would generally require prior estimation of the expected beam direction. In order to determine beam location or position, power is usually measured at the four probe antennas 305 nearest to the estimated location via the dynamic testing instruments 900 (e.g., power meters, power sensors, spectrum analyzers, oscilloscopes) or any RF power measurement device). Upon reception, a surface fit routine is preferably performed to determine the actual beam location. The surface fit procedure generally requires knowledge of the beam shape at each probe antenna 305 and conducting a calibration procedure prior to testing in which the beam shape at each probe antenna 305 is measured and recorded.

Specifically, beam tracking is preferable performed by monitoring the power from the probe antennas 305 or probe horns nearest to the estimated beam position. The power from each probe antennas 305 may be measured by power meters connected to the switch array outputs selectively coupled to the appropriate probe antennas 305. Additionally, beam position may be determined by comparing the power from the estimated four nearest probe antennas 305 and using appropriate two dimensional optimization methods to locate the position of maximum power. In a preferred approach, the beam shape at each of the probe antennas 305 may be measured and stored in the processor 700 for use in the optimization calculations.

Tracking a beam 310 that is moving or transitioning during testing is also possible. A series of position measurements may be made, wherein each step size is preferably determined by the time it takes to compute a position. Additionally, each new position may be estimated based on the previous position and the expected path and slew rate. When the next measurement is made, the estimated position is preferably updated. This iterative measurement prediction approach is generally akin to that used in navigation applications of Kalman filtering. This process can also be used to extend the operation to higher frequency beams 310 not always visible to four adjacent probe antennas 305.

Finally, with multiple, simultaneous beams 310, overlapping beams 310 might also occur. In this case, when two beams 310 are pointed or directed near the same probe antenna 305 and partially overlap, separating and identifying the beams 310 may be necessary. In most cases, each beam 310 will typically have a unique frequency, thus enabling band pass filtering during post-processing to isolate them. However, if the beams 310 have similar frequencies, modulation can be used to mix or coalesce each beam 310 to a unique intermediate frequency that can be separately filtered.

It is important to note that, while other wireless test setups may utilize multi-probe configurations for radiated testing, these tests may be conducted to verify over-the-air (OTA) performance and not to measure beam pattern characteristics. Generally, these wireless systems are directed to MIMO wireless systems (e.g., systems with multiple antennas) utilizing modulation techniques that encode digital data on multiple carrier frequencies (e.g., OFDM). Importantly, these wireless systems lack an electronic beam steering system 470, such as those used by phased array antennas and AESA antennas 410. Examples of such MIMO wireless systems include mobile cellular systems that include user equipment (e.g., mobile cellular phones) and base stations. In these MIMO wireless systems, the testing involved with these switched multi-probe antenna configurations involve emulating or simulating a multipath environment to test multipath propagation phenomenon affected by environmental factors (such as those where a base station to cell phone link will encounter). Given that base stations and cell phones utilize multiple antennas without an electronic beam steering system 470, these wireless systems (which is distinct from the MPAC 1000 and AESA antennas 410) are tested to determine their performance in a realistic, multi antenna environment. Such multi-probe wireless test configurations may emulate RF transmission either from the base station to the cell phone or from the cell phone to the base station and may be performed separately.

Furthermore, MIMO wireless systems generally utilize a multi-probe configuration to exercise cluster-wise probe antenna weighting, which generally involves beam shaping in response to environmental factors. Thus, unlike the MIMO systems, the phased array antennas such as the PESA and AESA systems, perform beam shaping within the pod 400 via the electronic beam steering system 470 prior to transmission. Thus, environmental factors, including links between the transmitter and receiver is not needed for the embodiments disclosed herein.

Accordingly, the MPAC 1000 is preferably designed to test phased array systems, and in particular, AESA systems. The antenna array 300 of switched probe antennas 305 preferably serves a detector array, which is not an integral part of a link between the transmitter and receiver. Therefore, the objective of the MPAC 1000 is preferably to determine proper operation and performance of the transmitting system, (e.g., beam formation, beam direction, and beam characteristics) and not establish a transmission environment.

The foregoing description of the embodiments of the MPAC for beam performance testing of an AESA system has been presented for the purposes of illustration and description. While multiple embodiments of the MPAC are disclosed, other embodiments will become apparent to those skilled in the art from the above detailed description. As will be realized, these embodiments are capable of modifications in various obvious aspects, all without departing from the spirit and scope of the present disclosure. Accordingly, the detailed description is to be regarded as illustrative in nature and not restrictive.

Although embodiments of the MPAC are described in considerable detail, other versions are possible such as, for example, orienting and/or attaching the AESA antenna or probe horn antennas in a different fashion. Therefore, the spirit and scope of the appended claims should not be limited to the description of versions included herein.

Except as stated immediately above, nothing which has been stated or illustrated is intended or should be interpreted to cause a dedication of any component, step, feature, object, benefit, advantage, or equivalent to the public, regardless of whether it is or is not recited in the claims. The scope of protection is limited solely by the claims that now follow, and that scope is intended to be broad as is reasonably consistent with the language that is used in the claims. The scope of protection is also intended to be broad to encompass all structural and functional equivalents.

What is claimed as new and desired to be protected by Letters Patent is set forth in the appended claims:

1. A multi-probe anechoic chamber (MPAC) for beam performance testing of an AESA system, the MPAC comprising:
   an AESA antenna having a plurality of subarrays configured to emit radio frequency (RF) energy;
   a plurality of probe antennas configured to receive said RF energy;
   a switch electrically coupled to said plurality of probe antennas and capable of selective coupling of said plurality of probe antennas to one or more output channels;
   one or more instruments electrically coupled to said one or more output channels and configured to detect and measure said RF energy emitted from said AESA antenna, such that said plurality of probe antennas only receives said RF energy; and
   a processor electrically coupled to said switch and said one or more instruments;
   wherein said processor controls said selective coupling of said switch, such that said processor, said switch, and said one or more instruments cooperatively monitor and characterize one or more beam parameters associated with said measured RF energy.

2. The MPAC according to claim 1, wherein said processor and said one or more instruments are further configured to cooperatively map said RF energy to said plurality of probe antennas to identify associated probe antennas receiving said RF energy, such that said processor is capable of determining beam shape and beam pointing accuracy.

3. The MPAC according to claim 1, wherein said beam parameters are derived from a group of beam parameters including: signal-to-noise ratio (SNR), signal strength, phase stability, frequency stability, and beam switching rates.

4. The MPAC according to claim 1, wherein said processor and said one or more instruments are configured to cooperatively perform closed loop testing.

5. The MPAC according to claim 1, wherein said switch is electrically coupled to N probe antennas being spatially separated and equidistant to each other, where N is a positive integer that is greater than or equal to two and is determined, based, at least in part, on a frequency of said RF energy.

6. The MPAC according to claim 1, further comprising a digitizer configured to digitize said RF energy into a digitized RF signal.

7. The MPAC according to claim 1, wherein said plurality of probe antennas are horn antennas.

8. The MPAC according to claim 1, wherein said plurality of probe antennas are arranged in a plurality of rows and a plurality of columns, thereby forming an antenna array in a rectangular arrangement.

9. An MPAC for beam performance testing of an AESA system, the MPAC comprising:
 an AESA antenna having a plurality of subarrays configured to emit an RF energy;
 an anechoic chamber having at least one wall with a plurality of probe antennas configured to receive said RF energy;
 a switch electrically coupled to said plurality of probe antennas and capable of selective coupling of said plurality of antenna probes to one or more output channels;
 one or more instruments electrically coupled to said one or more output channels and configured to detect and measure said RF energy of said AESA antenna, such that said plurality of probe antennas only receives said RF energy; and
 a processor electrically coupled to said switch and said one or more instruments:
 wherein said processor controls said selective coupling of said switch based on said RE energy detected by said one or more instruments, such that said processor, said switch, and said one or more instruments cooperatively monitor and characterize one or more beam parameters associated with said measured RF energy.

10. The MPAC according to claim 9, wherein said processor and said one or more instruments are further configured to cooperatively map said RF energy to said plurality of probe antennas to identify associated probe antennas receiving said RF energy, such that said processor is capable of determining beam shape and beam pointing accuracy.

11. The MPAC according to claim 9, wherein said beam parameters are derived from a group of beam parameters including: SNR, signal strength, phase stability, frequency stability, and beam switching rates.

12. The MPAC according to claim 9, wherein said processor and said one or more instruments are configured to cooperatively perform closed loop testing.

13. The MPAC according to claim 9, wherein said switch is electrically coupled to N probe antennas being spatially separated and equidistant to each other, where N is a positive integer that is greater than or equal to two and is determined, based, at least in part, on a frequency of said RF energy.

14. The MPAC according to claim 9, further comprising a digitizer for digitizing said RF energy into a digitized RF signal having a digitized RF carrier at a clock rate above a Nyquist sampling rate as determined by a highest frequency within said RF energy.

15. The MPAC according to claim 9, wherein said plurality of probe antennas are horn antennas.

16. The MPAC according to claim 9, wherein said plurality of probe antennas are arranged in a plurality of rows and a plurality of columns, thereby forming an antenna array in a rectangular arrangement.

17. An MPAC for beam performance testing of an AESA system, the MPAC comprising:
 an AESA antenna having a plurality of subarrays configured to emit an RF energy and an electronic beam steering system configured to control beam formation of said RF energy;
 an anechoic chamber having at least one wall, comprising a plurality of horn antennas configured to receive said RF energy, wherein each of said plurality of horn antennas comprises two outputs—a horizontal polarization output and a vertical polarization output;
 a switch electrically coupled to said plurality of horn antennas and capable of selective coupling of said plurality of horn antennas to one or more output channels;
 one or more instruments electrically coupled to said one or more output channels and configured to detect and measure said RF energy emitted from said AESA antenna, such that said plurality of horn antennas only receives said RF energy; and
 a processor electrically coupled to said switch and said one or more instruments;
 wherein said processor controls said selective coupling of said switch, such that said processor, said switch, and said one or more instruments cooperatively monitor and characterize one or more beam parameters associated with said measured RF energy, in accordance with static measurement testing and dynamic measurement testing; and
 wherein said one or more beam parameters are derived from a group of beam parameters including: SNR, signal strength, phase stability, frequency stability, beam shape, beam pointing accuracy, beam switching rates, and beam polarization.

18. The MPAC according to claim 17, wherein said switch is electrically coupled to N horn antennas being spatially separated and equidistant to each other, where N is a positive integer that is greater than or equal to two and is determined, based, at least in part, on a frequency of said RF energy.

19. The MPAC according to claim 18, further comprising a digitizer for digitizing said RF energy into a digitized RF signal having a digitized RF carrier at a clock rate above a Nyquist sampling rate as determined by a highest frequency within said RF energy.

* * * * *